United States Patent
Liu et al.

(10) Patent No.: US 10,466,330 B2
(45) Date of Patent: Nov. 5, 2019

(54) MAGNETIC RESONANCE DIFFUSION WEIGHTED IMAGING METHOD AND APPARATUS

(71) Applicant: Siemens Healthcare GmbH, Erlangen (DE)

(72) Inventors: Wei Liu, Shenzhen (CN); Nan Xiao, Shenzhen (CN); Le Zhang, Shenzhen (CN); Kun Zhou, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 184 days.

(21) Appl. No.: 15/797,090

(22) Filed: Oct. 30, 2017

(65) Prior Publication Data
US 2018/0120403 A1 May 3, 2018

(30) Foreign Application Priority Data
Oct. 31, 2016 (CN) .......................... 2016 1 0928617

(51) Int. Cl.
*G01V 3/00* (2006.01)
*G01R 33/563* (2006.01)
*G01R 33/48* (2006.01)
*G01R 33/561* (2006.01)

(52) U.S. Cl.
CPC ..... *G01R 33/56341* (2013.01); *G01R 33/482* (2013.01); *G01R 33/5616* (2013.01)

(58) Field of Classification Search
CPC .................................... G01R 33/56341
USPC .................................... 324/309, 307
See application file for complete search history.

(56) References Cited

U.S. PATENT DOCUMENTS

| 6,078,176 A * | 6/2000 | McKinnon ....... G01R 33/56341 324/307 |
| 9,645,211 B2 | 5/2017 | Zhou |
| 2007/0080685 A1 * | 4/2007 | Bydder ................ G01R 33/561 324/309 |
| 2010/0188085 A1 | 7/2010 | Huo et al. |

* cited by examiner

*Primary Examiner* — Louis M Arana
(74) *Attorney, Agent, or Firm* — Schiff Hardin LLP

(57) ABSTRACT

In a magnetic resonance diffusion weighted imaging method and apparatus, an excitation pulse flips a magnetization intensity vector of nuclear spins, a subject from the Z direction into the X-Y plane; and a diffusion pulse is applied to the magnetization intensity vector flipped into the X-Y plane in order to perform diffusion weighting. A flip pulse is applied to a magnetization intensity vector that does not meet Carr-Purcell-Meiboom-Gill conditions in the X-Y plane after diffusion weighting in order to flip it back to the Z direction. A data acquisition sequence is activated to acquire imaging data from a residual magnetization intensity vector meeting the Carr-Purcell-Meiboom-Gill conditions in the X-Y plane.

17 Claims, 6 Drawing Sheets

MAGNETIC RESONANCE DIFFUSION WEIGHTED IMAGING METHOD AND APPARATUS

BACKGROUND OF THE INVENTION

Field of the Invention

The present invention relates to the technical field of magnetic resonance imaging, in particular to a magnetic resonance diffusion weighted imaging method and apparatus.

Description of the Prior Art

Magnetic resonance (MR) imaging is an imaging technology involving biomagnetics and nuclear spin that has advanced rapidly with the development of computer technology, electronic circuit technology and superconductor technology. It uses a magnetic field and radio frequency (RF) pulses to induce oscillation of precessing hydrogen nuclei (i.e. H+) in human tissue, to generate RF signals that are processed by a computer to form an image. If an object is placed in a magnetic field and irradiated by suitable electromagnetic waves to produce resonance therein, and electromagnetic waves produced thereby are then analysed, it is possible to identify the positions and types of the atomic nuclei of which the object is composed. On this basis, a precise three-dimensional image of the interior of the object can be generated.

MR "tags" molecules by the magnetization of H+, without causing any interference to the process of diffusion thereof. Diffusion-weighted imaging (diffusion-weighted MR imaging, DWI) can be performed by adding a diffusion gradient to highlight diffusion effects in any conventional MR imaging sequence. DWI can detect the diffusion motion of water molecules in living tissue. By measuring the change in signal intensity that occurs in tissue before and after a diffusion sensitive gradient field is applied, the diffusion state (degree of freedom and direction) of water molecules in tissue can be detected, and the detection result can indirectly reflect microscopic structural characteristics of the tissue and changes therein.

Turbo Spin Echo (TSE) sequences have been widely used in DWI. However, due to the action of diffusion weighting gradient pulses and unavoidable movements of the person being scanned (even tiny movements), the magnetization intensity vector will have a certain phase distribution in the X-Y plane, with the result that part of the magnetization intensity vector in the X-Y plane cannot satisfy the Carr-Purcell-Meiboom-Gill (CPMG) conditions for TSE sequences, so that imaging quality is reduced.

SUMMARY OF THE INVENTION

An object of the present invention is to provide a magnetic resonance diffusion weighted imaging method and apparatus that improve imaging quality by overcoming the drawbacks of conventional approaches listed above.

A magnetic resonance diffusion weighted imaging method according to the invention has the following steps.

An RF radiator of an MR data acquisition scanner is operated in order to radiate apply an excitation pulse that flips a magnetization intensity vector of nuclear spins of a subject in the scanner from the Z direction into the X-Y plane.

The scanner is also operated to apply a diffusion pulse to the magnetization intensity vector flipped into the X-Y plane in order to perform diffusion weighting.

The scanner is further operated to apply a flip pulse to a residual magnetization intensity vector which still exists in the X-Y plane after diffusion weighting in order to flip any part of that residual vector that does not satisfy the CPMG conditions back to the Z direction.

The scanner is then operated to apply a data acquisition sequence to acquire raw data from the residual magnetization intensity vector in the X-Y plane that satisfies the CPMG conditions.

The acquired raw data are entered, as k-space data, into a memory by the computer that operates the scanner and the k-space data in the memory are transformed by that computer, or by another computer, into image data, which are made available as a data file.

In accordance with the present invention, any part of the magnetization intensity vector that does not meet CPMG conditions in the X-Y plane is removed by applying the flip pulse, so all the residual magnetization intensity vectors thereafter in the X-Y plane meet CPMG conditions, so a stable echo amplitude can be generated in the echo train, so the imaging quality is improved. Moreover, since the part of the magnetization intensity vector that does not meet CPMG conditions in the X-Y plane is removed from the plane, the need for refocusing pulse flip angle is also be reduced, hence RF energy deposition (SAR) can be reduced.

In an embodiment, after performing diffusion weighting and before applying the flip pulse, the method further includes operating the scanner to apply, in the readout direction of the data acquisition sequence, a dephasing gradient pulse that disperses the residual magnetization intensity vector in the X-Y plane. This prevents non-uniform brightness in the imaging data.

In an embodiment, the aforementioned dephasing gradient pulse is a first dephasing gradient pulse and the data acquisition sequence further includes a first refocusing pulse, a phasing gradient pulse after the first refocusing pulse, and a second dephasing gradient pulse after the phasing gradient pulse and before a second refocusing pulse of the next echo interval. The image is thereby further improved.

In an embodiment, the flip pulse has a flip angle of 90 degrees or 270 degrees.

Any part of the residual magnetization intensity vector that does not meet CPMG conditions can be flipped to the positive Z direction by a flip angle of 90 degrees, and a magnetization intensity vector which does not meet CPMG conditions can be flipped to the negative Z direction by a flip angle of 270 degrees. Therefore either of these the flip angles can be used, thereby allowing flexible configurations.

In an embodiment, the data acquisition sequence is any of a turbo spin echo sequence, a multiple-blade acquisition trajectory sequence, or a single-blade acquisition trajectory sequence.

In another embodiment, the phasing gradient pulse and the first dephasing gradient pulse have equal areas, and the direction of the phasing gradient pulse is the same as the direction of the first dephasing gradient pulse. A good phasing effect is thereby achieved.

In another embodiment, the second dephasing gradient pulse and the phasing gradient pulse have equal areas, and the direction of the second dephasing gradient pulse is opposite to the direction of the phasing gradient pulse thereby ensuring gradient balance during imaging data acquisition.

The present invention also encompasses a magnetic resonance imaging apparatus having a magnetic resonance data acquisition scanner that has a radio-frequency (RF) radiator and a gradient coil arrangement, and a control computer that operates the RF transmitter via an RF controller and that operates the gradient coil arrangement via a gradient controller. The apparatus has a memory, which is accessible by the control computer, organized as k-space, into which the computer enters acquired MR signals as k-space data. The control computer, or a separate image reconstruction computer, reconstructs an image of a subject from the acquired k-space data.

In accordance with the invention, the control computer operates the RF radiator and the gradient coil arrangement as follows:

The RF radiator of an MR data acquisition scanner is operated in order to radiate apply an excitation pulse that flips a magnetization intensity vector of nuclear spins of a subject in the scanner from the Z direction into the X-Y plane.

The scanner is also operated to apply a diffusion pulse to the magnetization intensity vector flipped into the X-Y plane in order to perform diffusion weighting.

The scanner is further operated to apply a flip pulse to a residual magnetization intensity vector which still exists in the X-Y plane after diffusion weighting in order to flip any part of that residual vector that does not satisfy the CPMG conditions back to the Z direction.

The scanner is then operated to apply a data acquisition sequence to acquire raw data from the residual magnetization intensity vector in the X-Y plane that satisfies the CPMG conditions.

The acquired raw data are entered, as k-space data, into a memory by the computer that operates the scanner and the k-space data in the memory are transformed by that computer, or by another computer, into image data, which are made available as a data file.

The present invention also encompasses a non-transitory, computer-readable data storage medium encoded with programming instructions (program code) that, when the storage medium is loaded into a computer system of a magnetic resonance imaging apparatus, cause the computer system to operate the magnetic resonance imaging apparatus in order to execute any or all of the embodiments of the method according to the invention, as described above.

DESCRIPTION OF THE PREFERRED EMBODIMENTS

The present invention is explained in further detail below in conjunction with the accompanying drawings and embodiments, which clarify the technical solution and advantages thereof, but do not exclusively define the scope of the invention.

Figure 1:
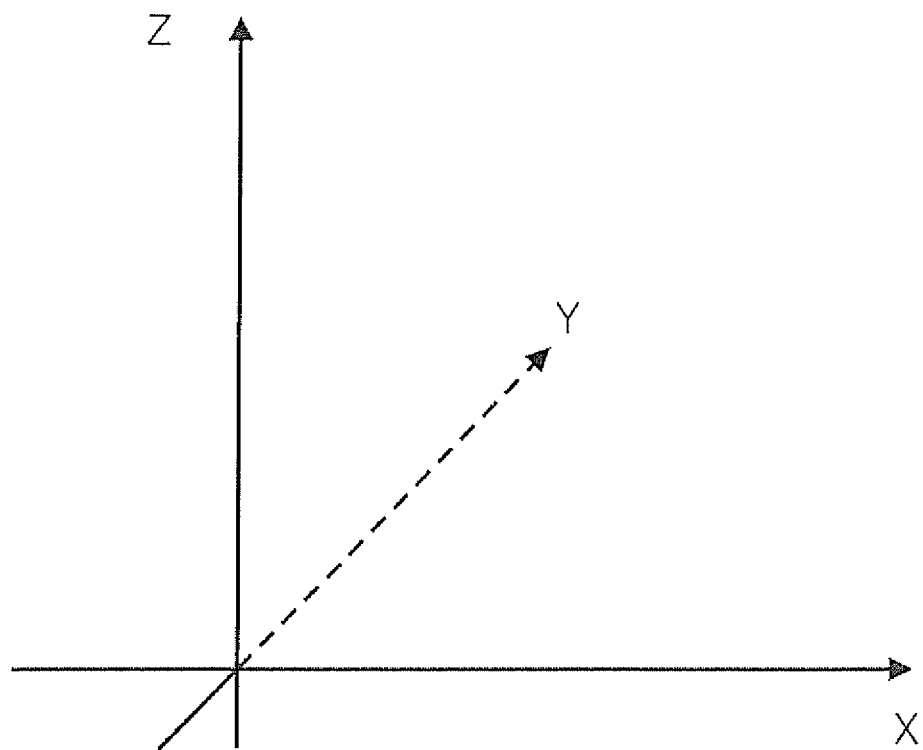
FIG. 1 shows a 3D Cartesian coordinate system in MR DWI.

In MR DWI, the direction of the main magnetic field $B_0$ is generally defined as the Z direction of a 3D Cartesian coordinate system; the other two directions, which are orthogonal to the main magnetic field $B_0$, being defined as the X direction and the Y direction, respectively. The X direction and Y direction together form the X-Y plane. FIG. 1 shows the 3D Cartesian coordinate system in MR DWI.

The combination of RF pulses, gradient pulses and setting parameters of the MR signal acquisition is called the pulse sequence. Data acquisition sequences such as TSE sequences or the BLADE sequence can significantly reduce sensitivity to non-uniformity in the main magnetic field $B_0$, and for this reason are used widely. However, when a magnetization intensity vector cannot meet CPMG conditions, the imaging quality of data acquisition sequences will be impaired.

Specifically, the CPMG conditions are:

(1) the initial phase of the magnetization intensity vector in the X-Y plane is the same as the phase of the refocusing pulse;

(2) the phase accumulated by the magnetization intensity vector in the X-Y plane between each pair of adjacent refocusing pulses is the same.

In the prior art, due to the action of diffusion weighting gradient pulses and movements of the person being scanned (even tiny movements), the magnetization intensity vector will have a certain phase distribution in the X-Y plane, with the result that part of the magnetization intensity vector in the X-Y plane cannot meet the CPMG conditions, so that imaging quality is reduced.

Specifically, in MR DWI processing, a 90-degree excitation pulse (and a corresponding slice selection gradient pulse) is generally used first of all to flip the magnetization intensity vector into the X-Y plane. A 180-degree RF pulse, and diffusion weighting gradient pulses on either side of the 180 degree pulse, are then used to perform diffusion weighting on the magnetization intensity vector that has been flipped into the X-Y plane. At this time, due to the action of the diffusion weighting gradient and movements of the person being scanned, the magnetization intensity vector has a certain phase distribution in the X-Y plane, such that part of the magnetization intensity vector does not meet CPMG conditions. Principally, part of the magnetization intensity vector does not meet CPMG conditions because the initial phase is different from the phase of the refocusing pulse.

The present invention encompasses an MR DWI method, which improves imaging quality by removing any part of the residual magnetization intensity vector that cannot meet CPMG conditions.

Figure 2:
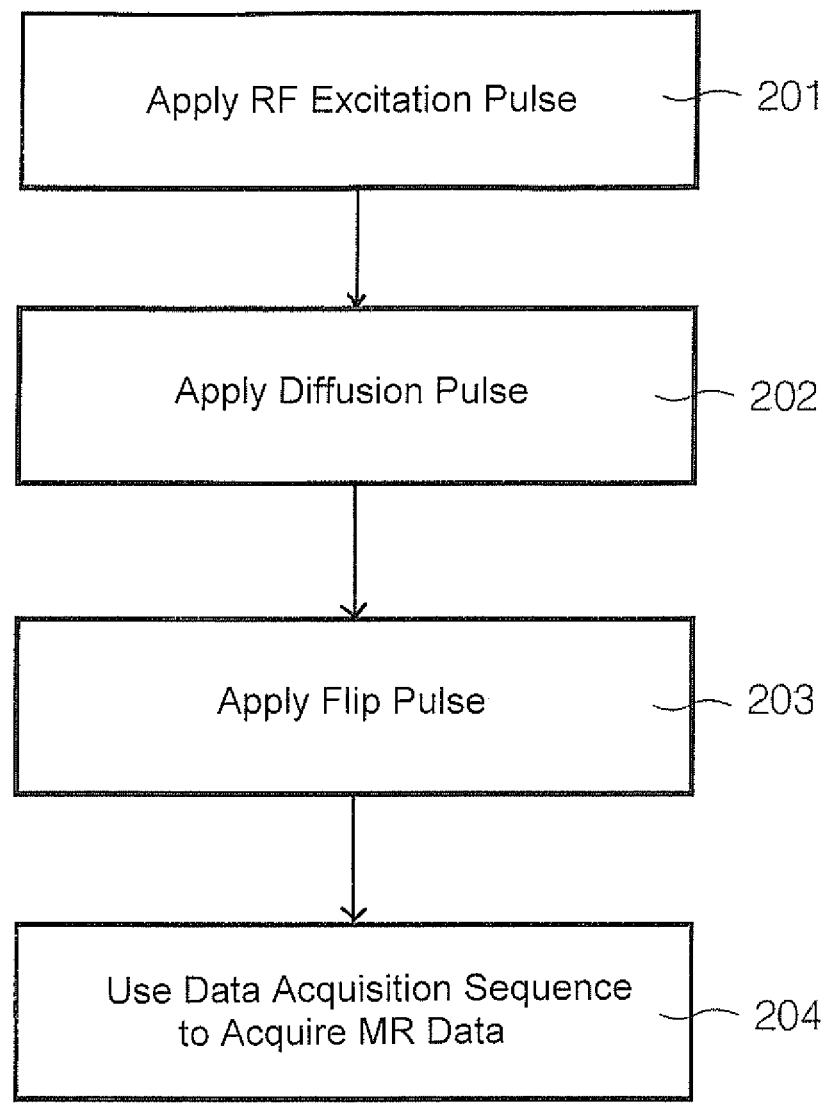
FIG. 2 is a flowchart of the MR DWI method according to an embodiment of the present invention.

FIG. 2 is a flowchart of the MR DWI method according to an embodiment of the present invention.

As FIG. 2 shows, the method includes:

Step 201: The RF radiator of an MR data acquisition scanner is operated in order to radiate apply an excitation pulse that flips a magnetization intensity vector of nuclear spins of a subject in the scanner from the Z direction into the X-Y plane.

Here, a 90-degree excitation pulse (and a corresponding slice selection gradient pulse) is generally used to flip the magnetization intensity vector into the X-Y plane.

Step 202: The scanner is also operated to apply a diffusion pulse to the magnetization intensity vector flipped into the X-Y plane in order to perform diffusion weighting.

Here, a 180-degree RF pulse, and diffusion weighting gradient pulses on either side of the 180 degree pulse, are generally used to perform diffusion weighting on the magnetization intensity vector flipped into the X-Y plane.

Step 203: The scanner is further operated to apply a flip pulse to a residual magnetization intensity vector which still exists in the X-Y plane after diffusion weighting in order to flip any part of that residual vector that does not satisfy the CPMG conditions back to the Z direction.

Preferably, a flip angle of the flip pulse is 90 degrees or 270 degrees.

When the flip angle is implemented as 90 degrees, the flip pulse flips a magnetization intensity vector, which does not meet CPMG conditions in the X-Y plane, to the positive Z direction. For example, the phase direction of the refocusing pulse can be defined as the X direction; after performing diffusion weighting, a magnetization intensity vector, which does not meet CPMG conditions in the X-Y plane, is distributed in the Y direction, and a magnetization intensity vector which meets CPMG conditions is distributed in the X direction. After applying a flip pulse with a flip angle of 90 degrees, the magnetization intensity vector which does not meet CPMG conditions is flipped to the positive Z direction (leaves the X-Y plane), and the magnetization intensity vector which meets CPMG conditions is flipped to the positive Y direction (still being retained in the X-Y plane).

When the flip angle is implemented as 270 degrees, the flip pulse flips a magnetization intensity vector, which does not meet CPMG conditions in the X-Y plane, to the negative Z direction. For example, the phase direction of the refocusing pulse can be defined as the X direction; after performing diffusion weighting, a magnetization intensity vector, which does not meet CPMG conditions in the X-Y plane, is distributed in the Y direction, and a magnetization intensity vector which meets CPMG conditions is distributed in the X direction. After applying a flip pulse with a flip angle of 270 degrees, the magnetization intensity vector which does not meet CPMG conditions is flipped to the negative Z direction (leaves the X-Y plane), and the magnetization intensity vector which meets CPMG conditions is flipped to the negative Y direction (still being retained in the X-Y plane).

Step 204: The scanner is then operates to apply a data acquisition sequence to acquire raw data from the residual magnetization intensity vector in the X-Y plane that satisfies the CPMG conditions.

Here, many types of data acquisition sequence may be used to acquire imaging data from a residual magnetization intensity vector meeting CPMG conditions in the X-Y plane. For example, a TSE sequence or a blade acquisition trajectory sequence may be used.

Preferably, a blade acquisition trajectory sequence may be implemented as a multiple-blade acquisition trajectory sequence or a single-blade acquisition trajectory sequence. The present invention may use a readout method similar to EPI to increase the data acquisition speed. Multiple-excitation diffusion weighting technology must use navigation data to correct phase errors between different blades; navigation data (a central part of k space) is embedded in blade (including multiple-blade) data acquisition and k-space filling methods, and there is no need to additionally acquire navigation data, so imaging efficiency is improved.

Since the magnetization intensity vector which does not meet CPMG conditions in the X-Y plane was removed by applying a flip pulse in step 203, all the residual magnetization intensity vectors in the X-Y plane meet CPMG conditions, and a stable echo amplitude can be generated in the echo train, therefore the imaging data acquired can improve imaging quality. Moreover, since the magnetization intensity vector which does not meet CPMG conditions in the X-Y plane was removed in step 203, the need for refocusing pulse flip angle during imaging data acquisition can also be reduced, hence RF energy deposition can be reduced.

The method also includes entering the acquired raw data, as k-space data, into a memory by the computer that operates the scanner and the k-space data in the memory are transformed by that computer, or by another computer, into image data, which are made available as a data file.

In an embodiment after performing diffusion weighting and before applying a flip pulse, the method also includes applying, in a readout direction of the imaging sequence, a dephasing gradient pulse for dispersing a magnetization intensity vector in the X-Y plane.

In another embodiment, the aforementioned dephasing gradient pulse is a first dephasing gradient pulse, and the data acquisition sequence in step 204 further includes a first refocusing pulse, a phasing gradient pulse after the first refocusing pulse, and a second dephasing gradient pulse after the phasing gradient pulse and before a second refocusing pulse of the next echo interval. Specifically, the first refocusing pulse is used to form a spin echo carrying imaging data; the phasing gradient pulse is used to refocus phase dispersion that was introduced by the first dephasing gradient pulse; and the second dephasing gradient pulse is used to balance the phasing gradient pulse. This causes the magnetization intensity vector in the X-Y plane to be uniformly dispersed, so that non-uniform brightness of subsequent imaging data can be prevented. Moreover, the application of a phasing gradient pulse can improve a phasing effect during data acquisition, and the application of a second dephasing gradient pulse can balance the phasing gradient pulse.

In another embodiment, the phasing gradient pulse and the first dephasing gradient pulse have equal areas, and the direction of the phasing gradient pulse is the same as the direction of the first dephasing gradient pulse, thereby ensuring a good phasing effect.

In another embodiment, the second dephasing gradient pulse and the phasing gradient pulse have equal areas, and the direction of the second dephasing gradient pulse is opposite to the direction of the phasing gradient pulse, thereby ensuring complete balance of gradients during imaging data acquisition by forming a series of stable echoes. In an embodiment of the present invention, even if a small-angle refocusing pulse is used in order to reduce the SAR, a stable echo can still be obtained.

Figure 3:
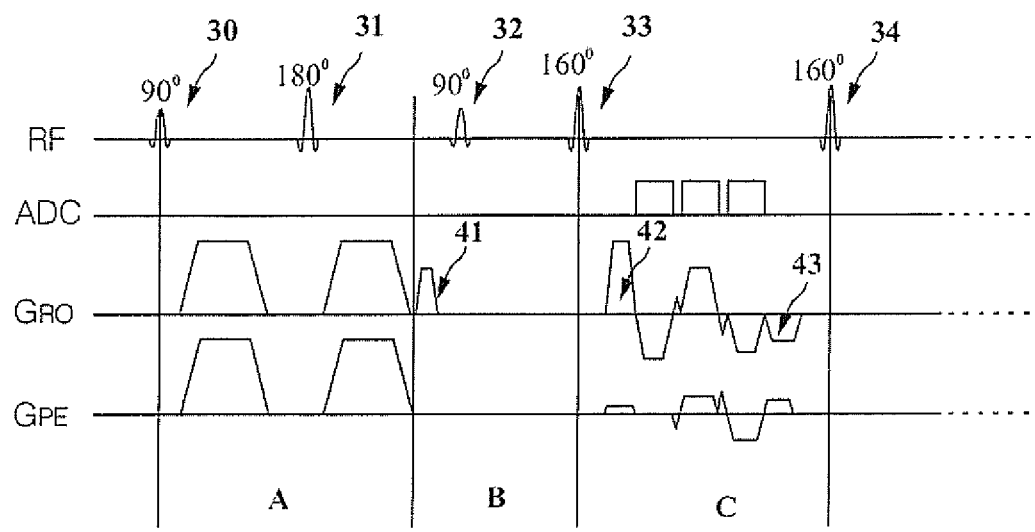
FIG. 3 is a schematically shows a pulse sequence according to an embodiment of the present invention.

FIG. 3 is a diagram of a pulse sequence according to an embodiment of the present invention. In this pulse sequence, a multiple-blade acquisition trajectory sequence is used to read out data.

In FIG. 3, based on chronological order of execution, the pulse sequence comprises three parts, namely (A), excitation and diffusion weighting part; (B), phase non-sensitive preparation part; (C), multiple-blade readout part. Moreover, in FIG. 3, RF pulses, analog-to-digital conversion (ADC), readout direction ($G_{RO}$) and phase encoding ($G_{PE}$) direction are shown from top to bottom.

These three parts are explained in detail separately below.

A, excitation and diffusion weighting part:

The excitation and diffusion weighting part specifically comprises: first of all, applying a 90-degree excitation pulse 30 (and a corresponding slice selection gradient) to flip a magnetization intensity vector into the X-Y plane. Then a 180-degree RF pulse 31, and diffusion weighting gradient pulses in a phase encoding direction on two sides of the 180-degree pulse 31, are applied, to perform diffusion weighting on the magnetization intensity vector in the X-Y plane. For details of the specific processing procedure of the excitation and diffusion weighting part, corresponding processing in the prior art may be referred to.

After diffusion weighting, due to the action of the diffusion weighting gradient and movements of the person being scanned, the magnetization intensity vector has a certain phase distribution in the X-Y plane, such that CPMG conditions are no longer met.

B, phase non-sensitive preparation part:

The phase non-sensitive preparation part is used to eliminate dependence on magnetization intensity vector phase during data acquisition in the subsequent multiple-blade readout part.

The phase non-sensitive preparation part comprises: applying a dephasing gradient pulse 41 in the readout ($G_{RO}$) direction, such that the magnetization intensity vector in the X-Y plane is uniformly dispersed. A 90-degree flip pulse 32 is then excited, to flip a magnetization vector which does not meet CPMG conditions in the X-Y plane back to the Z direction, and retain a magnetization vector which meets CPMG conditions in the X-Y plane.

(C), multiple-blade readout part:

The multiple-blade readout part is used to realize magnetization intensity vector encoding and data acquisition. At this time all the magnetization intensity vectors in the X-Y plane meet CPMG conditions, because the phase non-sensitive preparation part was performed, therefore the flip angle of the refocusing pulse may be less than 180 degrees (preferably more than 120 degrees), so that RF energy deposition can be greatly reduced. Moreover, since all the magnetization intensity vectors in the X-Y plane meet CPMG conditions, the magnetization intensity vectors can be refocused effectively and generate stable imaging data, thereby improving imaging quality.

In the multiple-blade readout part, after the first refocusing pulse 33 (assumed to be) 160°, a phasing gradient pulse having the same area as, and being in the same direction as, the dephasing gradient pulse 41 in the phase non-sensitive preparation part is then applied in the readout ($G_{RO}$) direction, to refocus the phase dispersion introduced by the dephasing gradient pulse 41 in the phase non-sensitive preparation part. In FIG. 3, the area of trapezoid 42 is the sum of the area of the phasing gradient pulse and a pre-dephasing pulse already existing in a multiple-blade sequence. Therefore, the area of the trapezoid 42 is greater than the area of the dephasing gradient pulse 41. Furthermore, before the next refocusing pulse 34 (assumed to be) 160°, a dephasing gradient pulse having the same area as, and being in the opposite direction to, the phasing gradient pulse is applied in the readout ($G_{RO}$) direction, to ensure that the gradient between this and the next readout (i.e. between two adjacent refocusing pulses) is balanced. In FIG. 3, the area of trapezoid 43 is the difference between the area of the phasing gradient pulse and a pre-dephasing pulse already existing in a multiple-blade sequence. Therefore, the area of the trapezoid 43 is less than the area of the dephasing gradient pulse 41.

An embodiment of the present invention has been explained above using a multiple-blade acquisition trajectory sequence and a 90-degree excitation flip pulse in a phase non-sensitive preparation part as an example; those skilled in the art will realize that such a description is merely demonstrative, and not intended to exclusively define the scope of the present invention.

Figure 4:
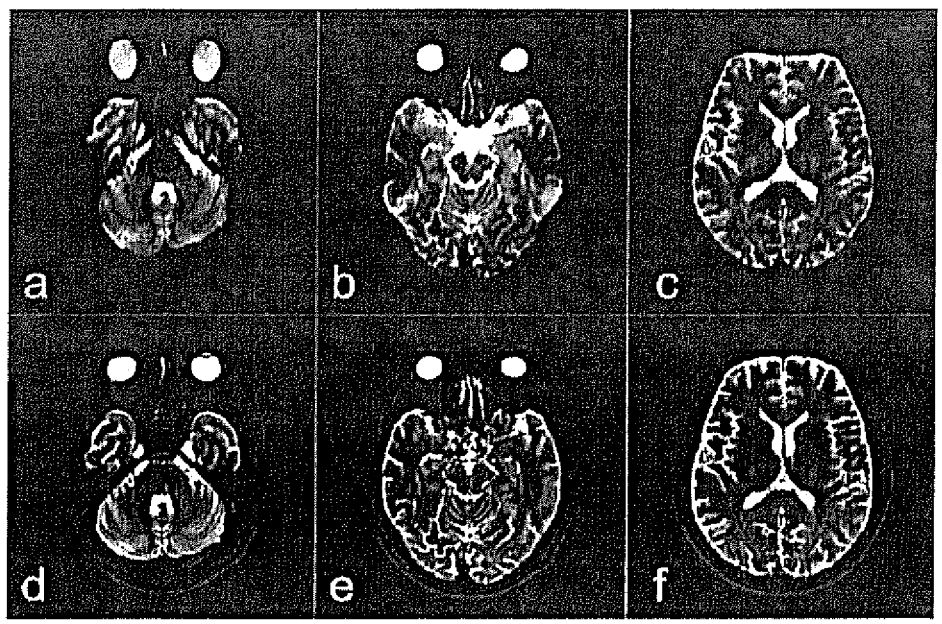
FIG. 4 is a comparison of sample images acquired according to an embodiment of the present invention, with sample images acquired according to the prior art.
Figure 5:
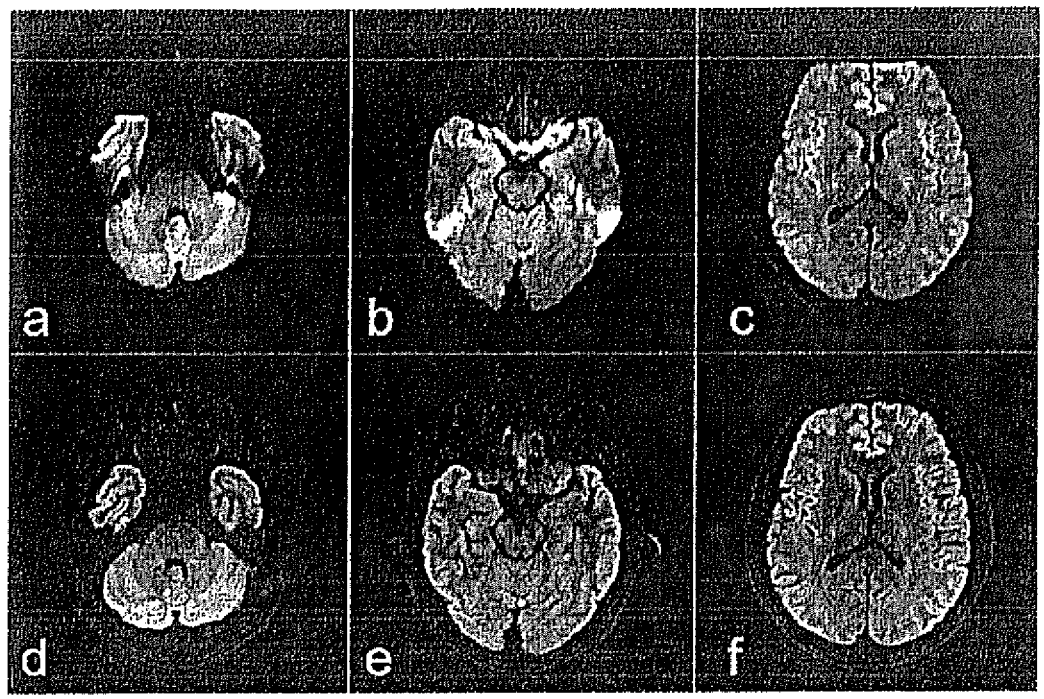
FIG. 5 is a further comparison of sample images acquired according to an embodiment of the present invention, with same images acquired according to the prior art.

FIG. 4 is a comparison of sample images acquired according to an embodiment of the present invention, with sample images acquired according to the prior art. FIG. 5 is a further comparison of sample images according to an embodiment of the present invention, with sample images acquired according to the prior art.

An embodiment of the present invention employs blade imaging technology; the blade pulse sequence is realized on a Siemens 3 Tesla MR system, using the following parameters: b value=0 or 1000 s/mm$^2$; visual field=235×235 mm$^2$; image matrix size=192×192; diffusion weighting method is 4 scans; a unipolar gradient is used to perform diffusion weighting; the number of averages is 1; bandwidth/pixels=520 Hz/Pixel; echo train length of TSE=9; echo train length of EPI=5; flip angle of refocusing pulse=135°.

In order to perform comparison, an acquisition method in the prior art uses a single-excitation EPI sequence to acquire an image; specific parameters are similar to those in the abovementioned blade pulse sequence, with the following differences: bandwidth/pixels=1050 Hz/Pixel; the number of averages for an image when b=0 is 2; the number of averages for an image when b=1000 is 4.

In the comparison of FIG. 4, b=0. In FIG. 4, the top row shows three sub-images obtained by a prior art sequence, namely sub-image a, sub-image b and sub-image c; it can be seen that the three sub-images in the top row exhibit obvious image deformation and magnetic susceptibility artifacts. The bottom row is three sub-images obtained using a sequence in an embodiment of the present invention, namely sub-image d, sub-image e and sub-image f; it can be seen that the three sub-images in the bottom row eliminate image deformation and magnetic susceptibility artifacts, and the clarity and sharpness of the images are also significantly improved.

In FIG. 5, b=1000. In FIG. 5, the top row shows three sub-images obtained by a prior art sequence, namely sub-image a, sub-image b and sub-image c; it can be seen that the three sub-images in the top row exhibit obvious image deformation and magnetic susceptibility artifacts. The bottom row is three sub-images obtained using a sequence in an embodiment of the present invention, namely sub-image d, sub-image e and sub-image f; it can be seen that the three sub-images in the bottom row eliminate image deformation and magnetic susceptibility artifacts, and the clarity and sharpness of the images are also significantly improved.

Figure 6:
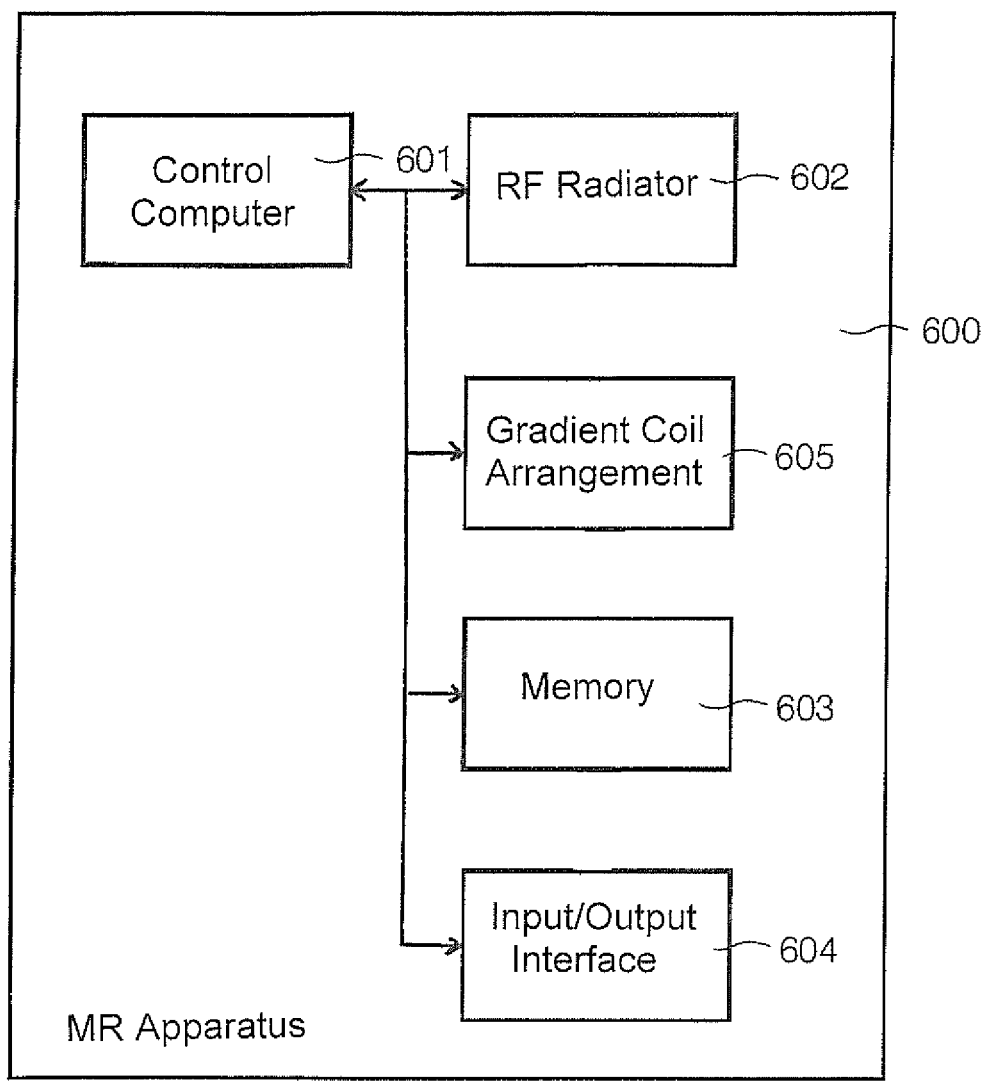
FIG. 6 is a block diagram of an MR DWI apparatus according to an embodiment of the present invention.

FIG. 6 is a block diagram of a magnetic resonance imaging apparatus 600, designed to implement diffusion weighted imaging (DWI) in accordance with the present invention.

The apparatus 600 has a control computer (or computer system) 601, that operates an RF transmitter 602 and a gradient coil arrangement 605 of a magnetic resonance data acquisition scanner, in the manner described above in order to implement the method according to the invention. As is conventional, the magnetic resonance data acquisition scanner also includes a basic field magnet that generates the basic magnetic field in which an examination subject is situated.

The MR data acquired in accordance with the present invention are entered into a memory 603, which is organized as k-space, so that the data entered therein constitute a file of k-space data. The k-space data are transformed in a known manner into image data. An image corresponding to the image data can be displayed at an input/out interface 604, which can also receive entries made by an operator into the computer 601, for operating the apparatus 600.

The MR DWI proposed in an embodiment of the present invention may be written in the form of a plug-in program installed in a MR DWI main control unit, a personal computer or a mobile terminal, etc., abiding by an application programming interface with given specifications, or may be packaged as an application program for a user to download and use.

The storage medium can be, but is not limited to a floppy disk, an optical disk, a DVD, a hard disk, a flash memory, etc.

Furthermore, the MR DWI storage medium may be flash memory (Nand flash), such as USB stick, CF card, SD card, SDHC card, MMC card, SM card, memory stick, xD card, etc.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance (MR) diffusion weighted imaging method comprising:
    operating an RF radiator of an MR data acquisition scanner in order to radiate an RF excitation pulse that flips a magnetization intensity vector of nuclear spins of a subject in the scanner from a Z direction into the X-Y plane of a Cartesian coordinate system;
    operating a gradient coil arrangement of the MR data acquisition scanner in order to apply a diffusion pulse to the magnetization intensity vector flipped into the X-Y plane, so as to perform diffusion weighting;
    operating the RF radiator of the MR data acquisition scanner to radiate a flip pulse that acts on a residual magnetization intensity vector that still exists in the X-Y plane after said diffusion weighting, so as to flip any part of the residual magnetization vector in the X-Y plane, which does not satisfy the Carr-Purcell-Meiboom-Gill (CPMG) conditions in the X-Y plane back, to the Z direction;
    operating the gradient coil arrangement of the MR data acquisition scanner to apply a data acquisition sequence so as to acquire raw data from the magnetization intensity vector in the X-Y plane that satisfies the CPMG conditions; and
    entering said raw data into a memory accessible by a computer, and making the raw data available from the computer in electronic form as a data file.

2. A method as claimed in claim 1 comprising, in said computer, reconstructing diffusion weighted image data from said raw data in said raw data file, and thereby generating a further data file of diffusion weighted image data.

3. A method as claimed in claim 1 comprising, after performing said diffusion weighting and before applying said flip pulse, operating the MR data acquisition scanner to apply, in a readout direction of said data acquisition sequence, a dephasing gradient pulse that disburses the magnetization intensity vector in the X-Y plane.

4. A method as claimed in claim 3 wherein said dephasing gradient pulse is a first dephasing gradient pulse, and wherein said method comprises operating said MR data acquisition scanner to apply said data acquisition sequence with a first refocusing pulse, a phasing gradient pulse after said first refocusing pulse, and a second dephasing gradient after said phasing gradient pulse and before a second refocusing pulse of a next echo interval.

5. A method as claimed in claim 4 comprising operating said MR data acquisition scanner to apply said phasing gradient pulse and said first dephasing gradient pulse with equal areas, with a direction of the phasing gradient pulse being in a same direction as a direction of said first dephasing gradient pulse.

6. A method as claimed in claim 4 comprising operating said MR data acquisition scanner to apply said second dephasing gradient pulse and said phasing gradient pulse with equal areas, and with a direction of said second dephasing gradient pulse being opposite to a direction of said phasing gradient pulse.

7. A method as claimed in claim 1 comprising operating said MR data acquisition scanner to radiate said flip pulse with a flip angle of 90° or 270°.

8. A method as claimed in claim 1 comprising operating said MR data acquisition scanner to apply data acquisition sequence as a sequence selected from the group consisting of a turbo spin echo sequence, a multiple-blade acquisition trajectory sequence, and a single-blade acquisition trajectory sequence.

9. A magnetic resonance (MR) diffusion weighted imaging apparatus, comprising:
    an MR data acquisition scanner comprising a radio-frequency (RF) radiator and a gradient coil arrangement;
    a computer configured to operate said MR data acquisition scanner in order to cause said RF radiator to radiate an RF excitation pulse that flips a magnetization intensity vector of nuclear spins of a subject in the scanner from a Z direction into the X-Y plane of a Cartesian coordinate system;
    said computer being configured to operate the MR data acquisition scanner in order to cause the gradient coil arrangement to apply a diffusion pulse to the magnetization intensity vector flipped into the X-Y plane, in order to perform diffusion weighting;
    said computer being configured to operate the MR data acquisition scanner in order to cause the RF radiator to radiate a flip pulse that acts on a residual magnetization intensity vector that still exists in the X-Y plane after said diffusion weighting, so as to flip any part of the residual magnetization vector in the X-Y plane, which does not satisfy the Carr-Purcell-Meiboom-Gill (CPMG) conditions in the X-Y plane back to the Z direction;
    said computer being configured to operate the MR data acquisition scanner in order to cause the gradient coil arrangement to apply a data acquisition sequence so as to acquire raw data from the magnetization intensity vector in the X-Y plane that satisfies the CPMG conditions; and
    said computer being configured to enter said raw data into a memory accessible by said computer, and make the raw data available from the computer in electronic form as a data file.

10. An apparatus as claimed in claim 9 wherein said computer is configured to reconstruct diffusion weighted image data from said raw data in said raw data file, and thereby generate a further data file of diffusion weighted image data.

11. An apparatus as claimed in claim 9 wherein said computer, after performing said diffusion weighting and before applying said flip pulse, is configured to operate the MR data acquisition scanner in order to apply, in a readout direction of said data acquisition sequence, a dephasing gradient pulse that disburses the magnetization intensity vector in the X-Y plane.

12. An apparatus as claimed in claim 11 wherein said dephasing gradient pulse is a first dephasing gradient pulse, and wherein computer is configured to operate said MR data acquisition scanner to apply said data acquisition sequence with a first refocusing pulse, a phasing gradient pulse after said first refocusing pulse, and a second dephasing gradient after said phasing gradient pulse and before a second refocusing pulse of a next echo interval.

13. An apparatus as claimed in claim 12 wherein said computer is configured to operate said MR data acquisition scanner in order to apply said phasing gradient pulse and said first dephasing gradient pulse with equal areas, with a direction of the phasing gradient pulse being in a same direction as a direction of said first dephasing gradient pulse.

14. An apparatus as claimed in claim 12 wherein said computer is configured to operate said MR data acquisition scanner in order to apply said second dephasing gradient pulse and said phasing gradient pulse with equal areas, and with a direction of said second dephasing gradient pulse being opposite to a direction of said phasing gradient pulse.

15. An apparatus as claimed in claim 9 wherein said computer is configured to operate said MR data acquisition scanner in order to radiate said flip pulse with a flip angle of 90° or 270°.

16. An apparatus as claimed in claim 9 wherein said computer is configured to operate said MR data acquisition scanner in order to apply data acquisition sequence as a sequence selected from the group consisting of a turbo spin echo sequence, a multiple-blade acquisition trajectory sequence, and a single-blade acquisition trajectory sequence.

17. A non-transitory, computer-readable data storage medium encoded with programming instructions, said storage medium being loaded into a computer system of a magnetic resonance (MR) imaging apparatus having an MR data acquisition scanner with a radio-frequency (RF) radiator and a gradient coil arrangement, said programming instructions causing said computer system to:
    operate the RF radiator in order to radiate an RF excitation pulse that flips a magnetization intensity vector of nuclear spins of a subject in the scanner from a Z direction into the X-Y plane of a Cartesian coordinate system;
    operate the gradient coil arrangement in order to apply a diffusion pulse to the magnetization intensity vector flipped into the X-Y plane, in order to perform diffusion weighting;
    operate the RF radiator to radiate a flip pulse that acts on a residual magnetization intensity vector that still exists in the X-Y plane after said diffusion weighting, so as to flip any part of the residual magnetization vector in the X-Y plane, which does not satisfy the Carr-Purcell-Meiboom-Gill (CPMG) conditions in the X-Y plane back to the Z direction;
    operate the gradient coil arrangement to apply a data acquisition sequence so as to acquire raw data from the magnetization intensity vector in the X-Y plane that satisfies the CPMG conditions; and
    enter said raw data into a memory accessible by said computer system, and make the raw data available from the computer system in electronic form as a data file.

* * * * *